United States Patent [19]

Penunuri

[11] Patent Number: 5,287,036
[45] Date of Patent: Feb. 15, 1994

[54] METHOD AND APPARATUS FOR ACOUSTIC WAVE INDUCTANCE

[75] Inventor: David Penunuri, Fountain Hills, Ariz.

[73] Assignee: Motorola, Inc., Schaumburg, Ill.

[21] Appl. No.: 844,333

[22] Filed: Mar. 2, 1992

[51] Int. Cl.$^5$ ............................................. H01L 41/08
[52] U.S. Cl. .............................. 310/313 R; 310/313 B; 310/313 D; 333/193
[58] Field of Search .............. 310/313; 333/150–155, 333/193–196

[56] References Cited

U.S. PATENT DOCUMENTS

| | | | |
|---|---|---|---|
| 3,518,584 | 6/1970 | Miller et al. | 333/80 |
| 3,715,693 | 2/1973 | Fletcher et al. | 333/80 |
| 3,886,504 | 5/1975 | Hartmann et al. | 310/313 D X |
| 4,006,436 | 2/1977 | Heeks | 310/313 D X |
| 4,144,507 | 3/1979 | Shreve | 333/191 |
| 4,166,258 | 8/1979 | Tseng | 310/313 D X |
| 4,577,168 | 3/1986 | Hartmann | 333/170 |
| 4,599,587 | 7/1986 | Hartmann et al. | 333/176 |
| 4,616,197 | 10/1986 | Wright | 310/313 D X |
| 4,635,009 | 1/1987 | Ebata | 333/195 |
| 4,742,319 | 5/1988 | Sone | 310/313 D X |
| 4,812,785 | 3/1989 | Pauker | 331/117 |
| 4,978,879 | 12/1990 | Satoh et al. | 310/313 A |
| 5,077,545 | 12/1991 | Gopani et al. | 333/195 |

OTHER PUBLICATIONS

T. W. Grudkowski, G. K. Montress, M. Gilden, and J. F. Black, "GaAs Monolithic SAW Devices for Signal Processing and Frequency Control", by IEEE Catalogue No. 80CH1602-2, pp. 88–97, Sonics and Ultrasonics Symposium Proceedings for 1980.

M. H. Francome and S. V. Krishnaswamy, "Growth and Properties of Piezoelectric and Ferroelectric Films", in Journal of Vacuum Science and Technology A 8(3), pp. 1382–1390.

B. S. Kwak, E. P. Boyd, and A. Erbil, "Metalorganic Chemical Vapor Deposition of PbTiO$_3$ Thin Films", Applied Physics Letters, 53(18), pp. 1702–1704.

Primary Examiner—Mark O. Budd
Attorney, Agent, or Firm—Frederick M. Fliegel

[57] ABSTRACT

An inductive element for impedance matching comprises an acoustic wave propagating substrate and an acoustic wave transducer coupled to the acoustic wave propagating substrate. The acoustic wave transducer has an effective length $L_{eff}$ such that $Le_{eff} \geq C_2 v_a / f_o k^2$, where $C_2$ is a numerical factor such that $C_2 \geq 2$, $v_a$ represents an acoustic velocity, $f_o$ represents an acoustic wave transducer center frequency and $k^2$ denotes an acoustic wave propagating substrate electromechanical coupling coefficient. Reflecting elements are provided on the substrate in the principal acoustic propagation directions to form a resonant acoustic cavity. The device exhibits inductive impedance and high Q over a significant frequency range in small physical size.

32 Claims, 8 Drawing Sheets

METHOD AND APPARATUS FOR ACOUSTIC WAVE INDUCTANCE

CROSS-REFERENCE TO RELATED APPLICATIONS

This application is related to co-pending patent application Ser. No. 07/733,933, filed on Jul. 22, 1991 and U.S. Pat. No. 5,212,420 issued on May 18, 1993 and filed on Sep. 3, 1991 which are assigned to the same assignee as the present application.

FIELD OF THE INVENTION

This invention relates in general to the field of radio frequency microelectronic components, and, more particularly, to microelectronic elements for realizing inductance.

BACKGROUND OF THE INVENTION

There is an ongoing need for component miniaturization in radio wave communication devices. For example, smaller and more efficient components are needed for light-weight, hand-portable cellular telephones, wireless local area networks for linking computer systems within office buildings in a readily reconfigurable fashion, wristwatch-sized paging apparatus and other devices for promoting rapid, efficient and flexible voice and data communication.

These and other radio frequency devices include high frequency components, such as amplifiers, mixers, oscillators, digital circuitry and interconnections therebetween. Component interconnection often requires impedance matching to obtain efficiency and minimize signal loss and additional amplification. Many components present capacitive impedances or immitances so that inductive elements must be used for impedance matching.

Inductors comprising conductors depend on the interaction of magnetic fields and currents contained therein. As such, inductors are most often realized in the form of conductors coiled to increase magnetic interactions therebetween. This physical form does not lend itself to microelectronic realization in a fashion consistent with achieving small size, ease of construction and high quality factor (low loss) coupled with inductance values of a few nanoHenries or more.

Thus, what are needed are practical, economical methods and apparatus for providing radio frequency microelectronic components exhibiting inductance together with a small form factor and particularly for providing high quality factor. This need is particularly severe in the frequency range from 50 MegaHertz to about 2 GigaHertz.

DESCRIPTION OF THE PRIOR ART

Figure 1:
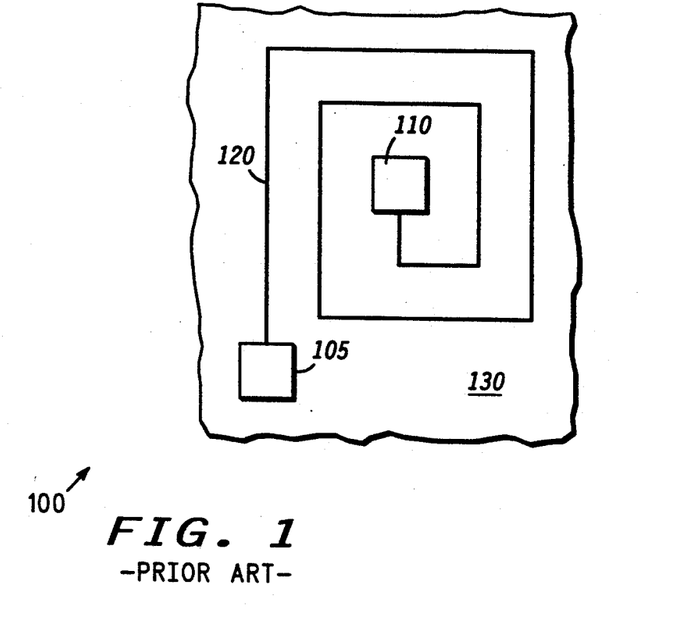
FIG. 1 is a simplified plan view of a spiral inductor according to the prior art.

FIG. 1 illustrates an example of one type of prior art microelectronic spiral inductor 100 which has found wide use. Microelectronic spiral inductor 100 comprises bonding pads 105, 110 and spiral conductor 120 on substrate 130. Substrate 130 typically comprises a low dielectric constant material in a form facilitating conventional thin-film microelectronic fabrication practices. An example of such a material is quartz.

One difficulty encountered with microelectronic spiral inductors 100 is poor quality factor (i.e., low Q). In part this results from the planar spiral conductor arrangement which provides only comparatively low inductances per unit area. Another cause for poor quality factor is the generally poor conductivity of the thin metal film comprising spiral conductor 120. This latter problem may be reduced (but not eliminated) by electroplating spiral conductor 120 with gold or another highly conductive material to a greater thickness.

A further technique for decreasing series resistance of microelectronic spiral inductor 100 is to increase conductor cross-sectional area by increasing the width of spiral conductor 120. This technique enlarges spiral conductor 120, leading to increased size of any electronic assembly incorporating such inductors, without resulting in substantially higher quality factor. Typically, microelectronic spiral inductors 100 manufactured in this fashion exhibit quality factors of about 5–10 or less.

Another technique for realizing the effect of an inductor in microelectronic form is to employ a gyrator, as described in U.S. Pat. No. 3,518,584, entitled "Gyrator circuit utilizing a plurality of cascaded pairs of insulated-gate, field effect transistors", issued to J. A. Miller and D. H. Nash, in U.S. Pat. No. 4,812,785, entitled "Gyrator circuit simulating an inductance and use thereof as a filter or oscillator", issued to Vlad Parker, or in U.S. Pat. No. 3,715,693, entitled "Gyrator employing field effect transistors", issued to James C. Fletcher. Gyrators use active components such as transistors to present an input impedance having inductive characteristics. Disadvantages of gyrators include power consumption, poor high frequency response, limited bandwidth and low power handling capability.

Acoustic wave devices have been used as complex impedance elements in the prior art in order to realize notch filters, as is described for example in U.S. Pat. No. 4,577,168, entitled "Notch filter" and U.S. Pat. No. 4,599,587, entitled "Impedance element", both issued to Clinton S. Hartmann. In this example, two properties of unidirectional acoustic wave transducers are advantageously employed. These are, (1) a frequency-dependent real component or resistance manifested at frequencies near the acoustic wave transducer center frequency, and (2) an imaginary component or reactance specifically tailored to provide zero slope-versus-frequency imaginary component over the frequency range required for the particular application contemplated.

The above noted patents are incorporated herein by reference.

SUMMARY OF THE INVENTION

Accordingly, there is provided a new and improved apparatus for providing a microelectronic inductive component. The apparatus comprises an acoustic wave propagating substrate and an acoustic wave transducer coupled to the acoustic wave propagating substrate to provide a microelectronic inductance. The acoustic wave transducer has an effective length $L_{eff}$ such that $L_{eff} \cong C_2 v_a/f_o k^2$, where $C_2$ is a numerical factor, typically in the range from 2 to 5 or larger and desirably greater than 2, $v_a$ represents an acoustic velocity, $f_o$ represents an acoustic wave transducer center frequency, and $k^2$ denotes an acoustic wave propagating substrate electromechanical coupling coefficient.

In a preferred embodiment the apparatus comprises an acoustic wave filter and an acoustic inductance providing a predetermined electrical impedance. The apparatus includes in combination an acoustic wave propagating substrate and an acoustic wave transducer coupled to the acoustic wave propagating substrate to provide an acoustic inductance. The acoustic wave transducer has an effective number of electrode pairs $N_{eff}$ such that $N_{eff} > C_1/k^2$, where $C_1$ is a numerical factor, preferably greater than 2. Further included is an acoustic wave filter acoustically coupled to the acoustic wave propagating substrate and electrically coupled to the acoustic inductance to provide a predetermined electrical impedance.

A radio is desirably realized including at least one acoustic wave inductive device having an acoustic wave propagating substrate and an input for supplying electrical input signals. The acoustic wave inductance device further comprises at least one acoustic wave transducer electrically coupled to the input and acoustically coupled to the acoustic wave propagating substrate to provide an acoustic wave inductance. The acoustic wave transducer has a length L in accordance with $L \geq C_2 v_a/f_o k^2$.

The present invention further provides a method for realizing a microelectronic acoustic inductance. The method comprises the steps of providing an acoustic wave propagating substrate and coupling an acoustic wave transducer, having an effective length $L_{eff}$ such that $L_{eff} \geq C_2 v_a/f_o k^2$ 5—5 to the acoustic wave propagating substrate to provide a microelectronic acoustic inductance.

The method desirably but not essentially includes providing a first acoustic wave reflector disposed to a first side of the acoustic wave transducer in a propagation path of at least some of an acoustic wave emitted from the acoustic wave transducer.

The method further desirably but not essentially includes providing a second acoustic wave reflector disposed to a second side of the acoustic wave transducer in a propagation path of at least some of an acoustic wave emitted from the acoustic wave transducer.

The present invention desirably includes a method for providing an acoustic wave filter having a predetermined electrical impedance using a microelectronic inductance which comprises the steps of providing a piezoelectric substrate and coupling an acoustic wave transducer to the piezoelectric substrate to provide a microelectronic inductance. The acoustic wave transducer has a number of electrode pairs N greater than a numerical constant $C_1$ divided by a piezoelectric substrate electromechanical coupling coefficient, where $C_1$ is a numerical factor such that $C_1 > 2$. The acoustic wave filter is coupled to the piezoelectric substrate and the microelectronic inductance is coupled to the acoustic wave filter to provide a predetermined electrical impedance.

BRIEF DESCRIPTION OF THE DRAWINGS

A more complete understanding of the present invention may be derived by referring to the detailed description and claims when considered in connection with the figures, wherein like reference numbers refer to similar items throughout the figures, and:

DETAILED DESCRIPTION OF THE DRAWINGS

A broad variety of different acoustic wave types have application in microwave acoustic devices for frequency selection. These include surface acoustic waves (SAWs), also known as Rayleigh waves; surface skimming bulk acoustic waves (SSBWS or SSBAWs); pseudo surface waves or leaky surface waves; shallow bulk acoustic waves (SBAWs); surface transverse waves (STWs); Stonely, Sezawa, Love and other plate and higher order acoustic guided waves; longitudinal and shear bulk acoustic waves (BAWs) and the like. For convenience of explanation, the present invention is described in terms of SAWs, with the understanding that other varieties of acoustic propagation are also applicable, including but not limited to those listed above.

The terms "surface acoustic wave", "acoustic wave" and "surface wave" or "SAW" are employed interchangeably herein to stand for any suitable type of acoustic wave propagation. The terms "substrate material", "substrate" and "acoustic wave propagating substrate" are employed interchangeably herein to stand for any substrate that supports propagation of acoustic waves. The terms "reflection element" and "reflection electrode" are employed interchangeably herein to stand for reflection elements comprising electrodes. Further, the terms "comb electrode", "finger electrode", "finger", "interdigitated electrode" and "transducer electrode" are employed interchangeably herein to stand for acoustic wave transducer and/or reflector elements comprising electrodes.

Figure 2:
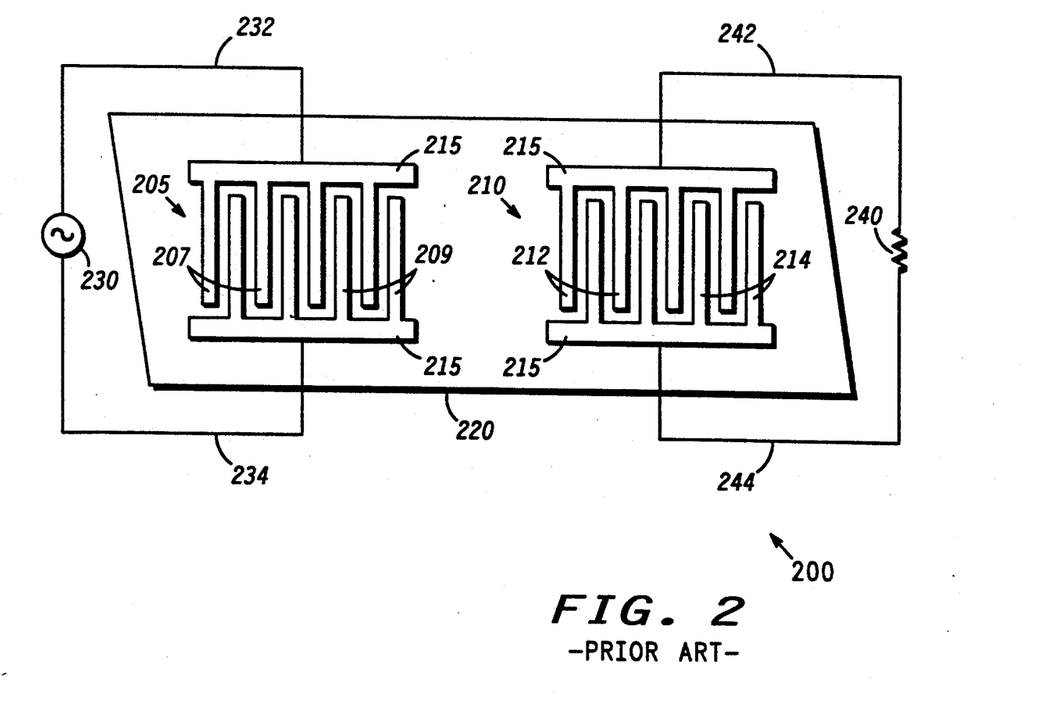
FIG. 2 is a simplified plan view of a conventional acoustic wave filter according to the prior art.

FIG. 2 is a plan view of conventional acoustic wave filter 200 according to the prior art. Acoustic wave filter 200 comprises substrate 220 and transducers 205 and 210 coupled to signal source 230 and load 240, respectively, by interconnections 232, 234 and 242, 244. Transducers 205 and 210 further comprise busses 215 and comb electrodes 207, 209, 212 and 214 coupled thereto. Transducers 205 and 210 convert electrical to acoustic energy, and vice versa. Interdigitated comb electrodes 207, 209, 212 and 214 are interconnected by busses 215. Electrodes 207, 209, 212 and 214, and busses 215 are made, typically, of thin-film metal which may be deposited, for example, by vacuum evaporation on the polished surface of substrate material 220 which is in whole or in part piezoelectric. Busses 215 and comb electrodes 207, 209, 212 and 214 making up acoustic wave transducers 205 and 210 are typically defined photolithographically, using processes well known in the art.

The piezoelectric nature of substrate material 220 causes mechanical waves to be emitted from transducer 205 when excited by electrical signals from signal source 230 having an appropriate frequency. Conversely, transducer 210 delivers electrical output signals to load 240 when transducer 210 is appropriately insonified, i.e., exposed to acoustic waves.

Applicants have discovered that the input impedance of an acoustic wave transducer as observed, by way of example, at interconnections 232, 234 provides inductive characteristics over a particular range of frequencies when the number of finger pairs N in the acoustic wave transducer satisfies the relation:

$$N > C_1/k^2, \quad (1)$$

where $k^2$ represents the piezoelectric coupling factor of the substrate material employed and $C_1$ is a numerical factor, typically about 2 to 5 or larger, and preferably greater than 2.5. Similar calculations are readily performed over portions of the transducer and the results combined to estimate an effective N or $N_{eff}$ for weighted transducers, as is well known in the art.

The magnitude of the Hilbert susceptance portion $B_A$ of the imaginary component of the transducer conductance is typically estimated from the relation describing an unweighted transducer having N finger pairs, center frequency $f_o$ and finger overlap W:

$$|B_A| = 8 f_o k^2 C_S W N^2, \quad (2)$$

where $C_S$ is a parameter of the substrate material employed describing the characteristic capacitance thereof, as is well known in the art. When the condition of Eq. 1 is met, the Hilbert susceptance and the static capacitance of the transducer combine to produce a net inductive reactance over a limited range of frequencies near the transducer center frequency. Under these conditions, the transducer length L can be expressed as:

$$L \geq C_2 v_a / f_o k^2, \quad (3)$$

where $v_a$ represents an acoustic velocity, $C_2$ is a numerical factor, typically in the range from 2 to 5 or larger and desirably greater than 2 and an unweighted acoustic wave transducer has been assumed as in Eq. 1, supra.

An effective length $L_{eff}$ is computed for weighted transducers or portions thereof, using methods well known in the art.

Figure 3:
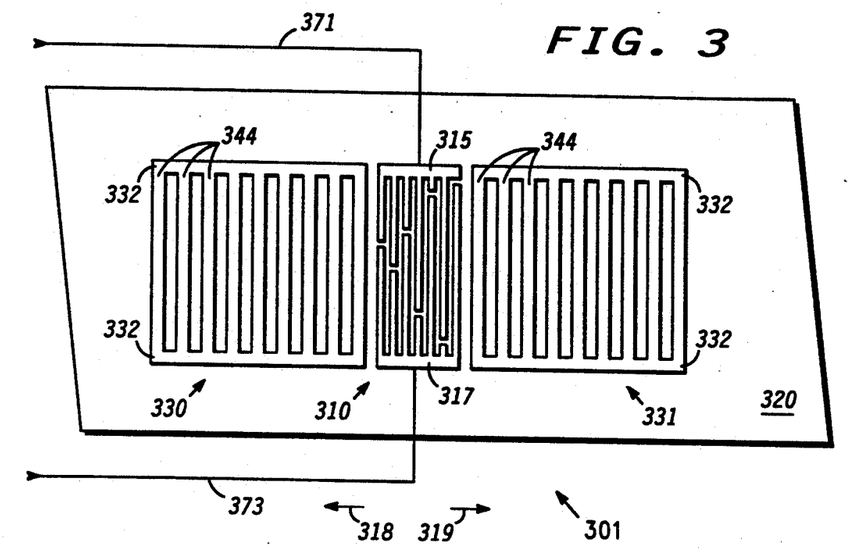
FIG. 3 is a simplified plan view of an acoustic wave device, in accordance with a preferred embodiment of the present invention.

FIG. 3 is a simplified plan view of acoustic wave device 301 according to the present invention. Acoustic wave device 301 comprises acoustic wave transducer 310 disposed on acoustic wave propagating substrate 320 together with acoustic reflectors 330, 331. Acoustic wave transducer 310 comprises busses 315, 317 coupled to interdigitated finger-shaped electrodes. Busses 315, 317 are coupled to interconnections 371, 373, respectively, which form an electrical port. Acoustic reflectors 330, 331 comprise optional busses 332 and reflection elements or electrodes 344. Transducer 310 is coupled to electrical circuitry (not shown) via interconnections 371, 373 and emits acoustic waves along principal acoustic propagation directions to the left (318) and right (319) of transducer 310 when electrical energy of an appropriate frequency is supplied via interconnections 371, 373.

Acoustic waves emitted in principal acoustic propagation directions 318, 319 to the left and right, respectively, of transducer 310 are incident upon acoustic reflectors 330, 331. Acoustic waves of appropriate frequency are reflected by reflectors 330, 331 back towards acoustic transducer 310. Acoustic transducer 310 and reflectors 330, 331 thus form a resonant cavity at certain frequencies which traps acoustic energy therein at those frequencies.

Typical piezoelectric materials comprising substrate 320 include lithium niobate ($LiNbO_3$), lithium tantalate ($LiTaO_3$), bismuth germanium oxide ($BiGeO_{20}$), bismuth silicon oxide ($BiSiO_{20}$), quartz ($SiO_2$), gallium arsenide (GaAs), cadmium sulfide (CdS), aluminum nitride (AlN), zinc oxide (ZnO) and the like, shaped into thin plates or discs and oriented to place a substrate surface into coincidence with a preferred crystallographic plane. While stoichiometric chemical formulae are provided for the substances mentioned hereinabove, it should be understood that deviations from stoichiometry are common in various methods of substrate material preparation and that such variations are intended to be included in the descriptions of materials comprising substrate 320. Principal acoustic propagation directions 318, 319 are aligned with a preferred crystallographic axis.

Substrate 320 is highly polished on one side to produce a planar surface having excursions which are very small compared to an acoustic wavelength. The surface finish is important both to minimize scattering of acoustic energy and also to facilitate fine-line photolithographic fabrication thereon. The acoustic wavelength is typically in the range of three to one hundred micrometers for acoustic wave devices operating in the frequency range from two GigaHertz to about fifty MegaHertz.

Figure 4:
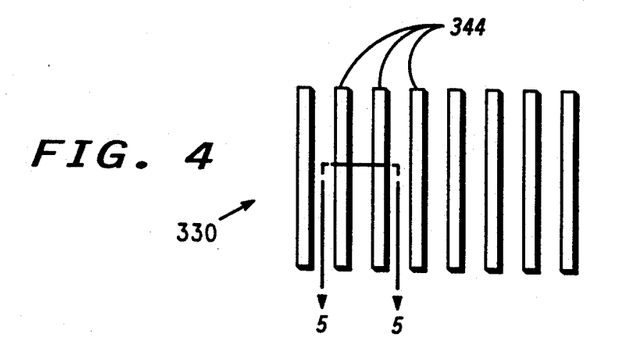
FIG. 4 is a simplified and enlarged plan view of an acoustic reflector structure, in accordance with the present invention.

FIG. 4 is a simplified plan view of acoustic reflector structure 330 in accordance with an embodiment the present invention. Acoustic reflector structure 330 comprises reflection elements or electrodes 344. Reflection elements 344 are typically fabricated from the same materials and by the same processes as transducer 310. Acoustic reflector structure 331 is similar to acoustic reflector structure 330. Optional bus bars 332 have been omitted in FIG. 4.

Figure 5:
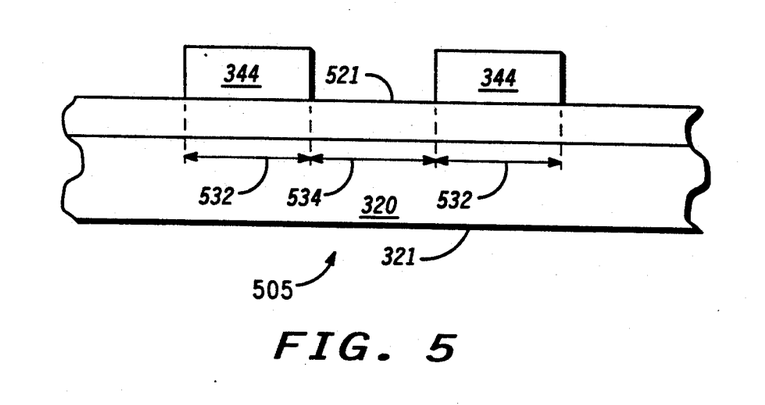
FIG. 5 is a simplified and enlarged side view, in section, taken on section lines 5—5' of FIG. 4, of a portion of the acoustic reflector structure thereof, in accordance with the present invention.

FIG. 5 is a simplified and enlarged side view, in section, taken on section lines 5—5' of FIG. 4, of portion 505 of acoustic reflector structure 330 thereof in accordance with the present invention. FIG. 5 depicts electrodes or reflection elements 344 having width 532 atop substrate 320, having gaps of breadth 534 intercalated therebetween. Substrate 320 comprises base material 321 having optional surface layer 521.

In accordance with the present invention, width 532 and breadth 534 may be approximately equal or may be different and are usually chosen to total an integer multiple of one-half of an acoustic wavelength. In accordance with one embodiment of the present invention, width 532 and breadth 534 are chosen to be approximately one-fourth of an acoustic wavelength. Width 532 and breadth 534 then total about one-half of an acoustic wavelength Specific widths 532 and breadths 534 are chosen in accordance with reflection properties of a specific material chosen for acoustic wave propagating substrate 320 and are optimized by means of acoustic reflection calculations and photolithographic considerations which are well known in the art.

Substrate 320 may comprise a planar element of a crystalline or amorphous material 321 upon which a thin layer of a piezoelectric material 521 has been deposited. Thin-film piezoelectric material 521 may comprise, for example, zinc oxide, as discussed in "GaAs Monolithic SAW Devices for Signal Processing and Frequency Control," by T. W. Grudkowski, G. K. Montress, M. Gilden, and J. F. Black, IEEE Catalogue No. 80CH1602-2, pages 88–97, or aluminum nitride, as discussed in "Growth and Properties of Piezoelectric and Ferroelectric Films," by M. H. Francome and S. V. Krishnaswamy, in Journal of Vacuum Science and Technology A 8(3), pages 1382–1390, or lithium niobate or other ferroelectric material, as discussed in the above and in "Metalorganic Chemical Vapor Deposition of $PbTiO_3$ Thin Films," by B. S. Kwak, E. P. Boyd, and A. Erbil, in Applied Physics Letters, 53(18), pages 1702–1704. As discussed above and elsewhere, in conjunction with optional layer 521, material 321 may comprise semiconductor materials such as by way of example silicon, insulators such as glass or fused quartz, for example, metals or other any other material having suitable acoustic, chemical and electronic properties.

Optional layer 521 in practice often comprises a plurality of layers of materials chosen, for example, to increase the adhesion of optional layer 521 to material 321, or to encourage a particular crystallographic orientation of optional layer 521. While FIG. 5 shows electrodes 344 as being disposed atop material 321 and optional layer 521, it is to be understood that electrodes 344 are often disposed between material 321 and optional layer 521. FIG. 5 is intended to encompass all such alternatives, modifications and variations as are commonly practiced in the art.

Figure 6:
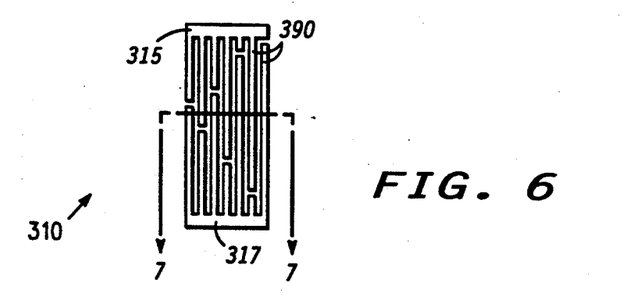
FIG. 6 is a simplified and enlarged plan view of the acoustic transducer structure of FIG. 3, in accordance with the present invention.

FIG. 6 is a simplified and enlarged plan view of acoustic transducer structure 310 of FIG. 3, in accordance with the present invention. Transducer structure 310 comprises electrodes 390 alternately connected to buss bars 315, 317. Alternative interconnections of electrodes 390, such as the well-known "split finger" configuration and many others well known in the art may be used.

As shown in FIG. 6, the lengths of electrodes 390 desirably vary in a manner known in the art as apodization, which variation is usefully employed to effect particular frequency response characteristics and also to shape the spatial distribution of acoustic energy emitted by transducer 310 (along the vertical axis as depicted in FIG. 6), as is well known in the art. Other techniques including withdrawal weighting, "dog-leg" electrodes, phase weighting, et cetera, well known in the art, may also be used.

Figure 7:
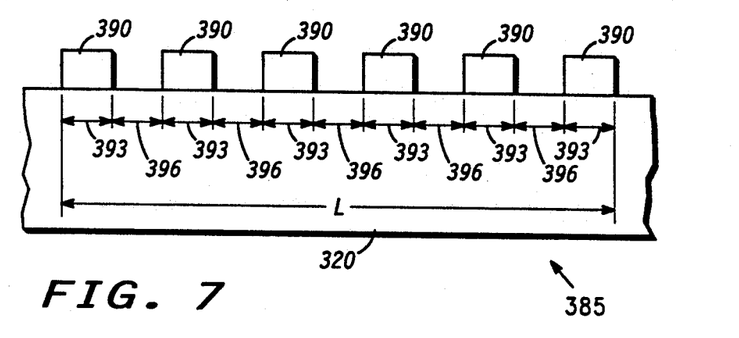
FIG. 7 is a simplified and enlarged side view, in section, taken on section lines 7—7' of FIG. 6, of a portion of the acoustic transducer structure thereof, in accordance with the present invention.

FIG. 7 is a simplified and enlarged, side view, in section, taken on section lines 7—7' of FIG. 6, of portion 385 of acoustic transducer 310 thereof, in accordance with the present invention. Portion 385 has length L and comprises electrodes 390 having widths 393, separated by gaps having breadths 396. Electrodes 390 are disposed atop acoustic wave propagating substrate 20.

Length L is chosen in accordance with Eqs. 1 and/or 3, supra, for the case where acoustic wave transducer 310 is unweighted, and is chosen in accordance with methods based on similar principles for cases where more complex electrode geometries are employed. Widths 393 and breadths 396 are typically about one-fourth of an acoustic wavelength and typically total about one-half of an acoustic wavelength. Widths 393 and breadths 396 may be chosen to be similar to widths 532 and breadths 534, (see FIG. 5) respectively, or may be chosen differently. The example of FIG. 3 illustrates one of many possible arrangements wherein width 393 and breadth 396 total approximately one-half of an acoustic wavelength while width 532 and breadth 534 total approximately one acoustic wavelength.

Transducer 310 of FIGS. 3 and 6 may be usefully employed as an inductive element when the conditions of Eqs. 1 and/or 3 above, or suitable adaptations thereof are met, either alone or in conjunction with one or more acoustic reflectors 330 and/or 331. Acoustic reflectors tend to promote higher inductance and Q through improved energy storage. When a unidirectional acoustic wave transducer is used for transducer 310 only a single acoustic reflector is desirable. When only limited Q is needed or when a resonant transducer is employed, one or both of acoustic reflectors 330, 331 may be eliminated.

Suitable choice of widths 393 and breadths 396 coupled with suitable interconnections of electrodes 390 allow transducer 310 alone to function as another embodiment of the present invention, without requiring distinct reflector structures such as reflectors 330, 331 of FIG. 3. For example, each of left and right regions of the acoustic wave transducer may comprise electrode groups within which all of the electrodes are coupled to just one of the buss bars, as described in more detail in connection with FIG. 8.

Figure 8:
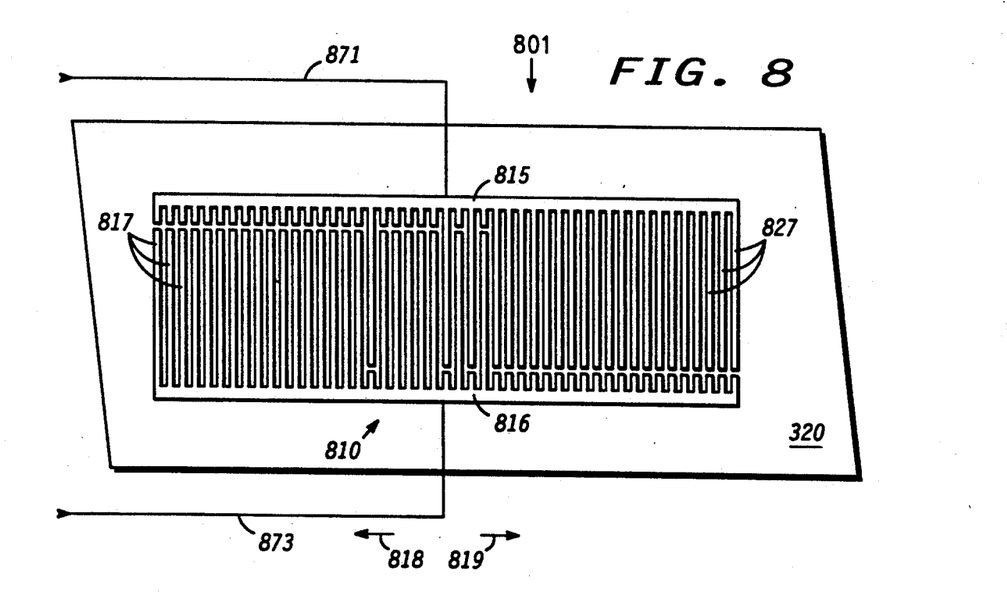
FIG. 8 is a simplified plan view of an acoustic wave device, in accordance with another embodiment of the present invention.

FIG. 8 is a simplified plan view of acoustic wave device 801, in accordance with another embodiment of the present invention. Acoustic wave device 801 comprises acoustic wave transducer 810 disposed on acoustic wave propagating substrate 320 together with transducer fingers/acoustic reflection elements 817, 827. Acoustic wave transducer 810 comprises busses 815, 816 coupled to electrodes 827, 817, respectively.

Electrodes 827, 817 are arranged in an interdigitated fashion in a central region of transducer 810 and further such that left and right regions of transducer 810 each comprise electrodes 817 or 827 coupled to only one of busses 815, 816. Acoustic waves are transduced predominantly in the region of transducer 810 wherein electrodes 817, 827 are interdigitated, i.e., within the central region of transducer 810, in response to electrical signals supplied via interconnections 871, 873. The central region of transducer 810 is chosen to have a number of finger pairs N and/or length L in accordance with the principles of Eqs. 1 and/or 3, supra.

Acoustic waves emitted in acoustic propagation directions 818, 819 to the left and right, respectively, within transducer 810 are incident upon electrodes 817, 827, respectively, which act as acoustic reflectors. Acoustic waves of appropriate frequency are reflected back towards the central region of acoustic transducer 810. Acoustic transducer 810 thus forms a resonant cavity at certain frequencies, trapping acoustic energy therewithin.

Acoustic wave devices 301 of FIG. 3 and 801 of FIG. 8 function as microelectronic inductive components or microelectronic inductors, also known as acoustic inductors, acoustic inductances or acoustic wave inductive devices, providing inductive characteristics at terminals 371, 373 and 871, 873, respectively.

Reflection elements 344 of FIGS. 3-5 and 817, 827 of FIG. 8 typically comprise electrodes fashioned from the same materials as transducer 310 of FIG. 3. Reflection elements 344 and 817, 827 are typically fabricated during the same photolithographic and metal patterning steps as transducers 310, 810, providing simplified manufacturing requirements. Reflection elements 344, 817, 827 may comprise grooves cut into or ridges extruding from the top surface of substrate 320, or strips of dielectric, semiconductor and/or metallic material deposited thereon, using means well known in the art.

Figure 9:
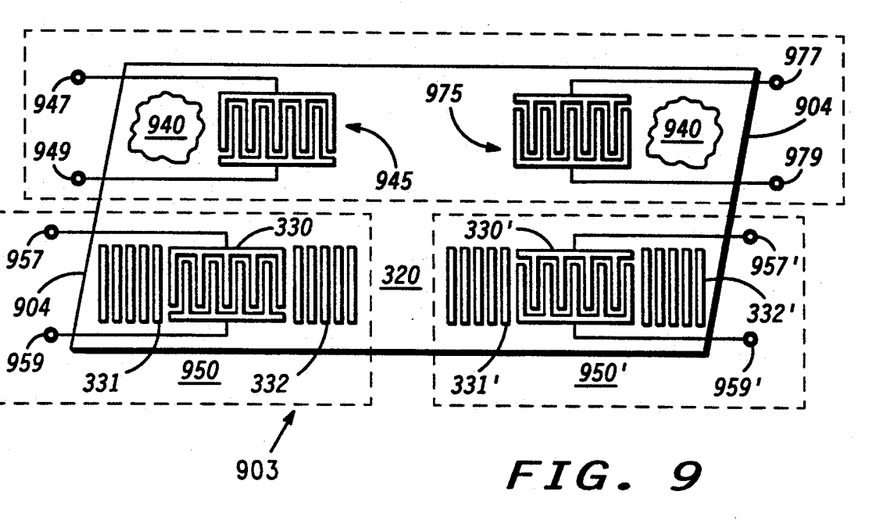
FIG. 9 is a simplified plan view of an acoustic wave filter monolithically cointegrated with microelectronic inductances, in accordance with the present invention.

FIG. 9 is a simplified plan view of impedance matched filter 903, in accordance with the present invention. Impedance matched filter 903 comprises acoustic wave filter 910 and microelectronic inductances 950, 950' monolithically cointegrated on acoustic wave propagating substrate 320. Acoustic wave filter 910 comprises transducers 945, 975, electrical interconnections 947, 949, 977 and 979, optional acoustic absorbers 940 and optional beveled edges 904 of acoustic wave propagating substrate 320. Microelectronic inductances 950, 950' have associated electrical interconnections 957, 959 and 957', 959', coupled to acoustic wave transducers 330, 330', respectively. Acoustic wave transducers 330, 330' have associated acoustic reflectors 331, 332 and 331', 332', respectively. Microelectronic inductances 950, 950' may comprise acoustic wave transducers such as transducer 310 or 810 of FIGS. 3 or 8, respectively, satisfying or in accordance with the principles of Eqs. 1 and/or 3, supra.

For purpose of example, acoustic wave filter 910 is illustrated as having two transducers 945, 975 and four associated electrical interconnections 947, 949, 977 and 979, however, acoustic wave filters and other acoustic wave devices usefully employ different numbers of acoustic wave transducers coupled to appropriate numbers of attendant electrical interconnections as is well known in the art.

Acoustic wave filter 910 operates by converting electrical signals present at, for example, electrical interconnections 947, 949 to acoustic energy via acoustic wave transducer 945. Acoustic energy from acoustic wave transducer 945 propagates to acoustic wave transducer 975 and is converted back to electrical energy which is delivered to electrical interconnections 977, 979 and thereby to external electrical circuitry (not shown).

Similarly, electrical signals present at electrical interconnections 977, 979 are converted to acoustic energy via acoustic wave transducer 975. Acoustic energy from acoustic wave transducer 975 propagates to acoustic wave transducer 945 and is converted back to electrical energy which is delivered to electrical interconnections 947, 949 and thereby to external electrical circuitry (not shown).

The efficiency of the conversion from electrical to acoustic energy and vice versa depends strongly on the frequency of the signal energy and on the detailed structure of acoustic wave transducers 945, 975, as is well known in the art. Other methods for usefully applying acoustic wave devices are also known in the art.

Optional acoustic absorbers 940 and/or beveled substrate edges 904 prevent acoustic "echoes" from distorting the desired frequency response of acoustic wave filter 910. Optional acoustic absorbers 940 typically comprise viscous substances such as room temperature vulcanizing silicone rubber (RTV), as is well known in the art. Optional beveled substrate edges 904 are typically cut with a high speed diamond saw when individual impedance matched filters 903 or acoustic wave filters 910 are separated from one another, as is well known in the art.

In a preferred embodiment, electrical interconnections 947, 949 (or 949, 947) of acoustic wave filter 910 may be coupled to interconnections 957, 959, respectively, of microelectronic inductance 950, by interconnections made on the surface of substrate 320, allowing transducer 945 and microelectronic inductance 950 to be interconnected to external circuitry (not shown) by a pair of wirebonds or other suitable interconnections to provide a predetermined impedance.

Similarly, microelectronic inductance 950' may be coupled to acoustic wave transducer 975 using appropriate metallization on substrate 320 and thence to external circuitry by wire bonds or other suitable means.

Figure 10:
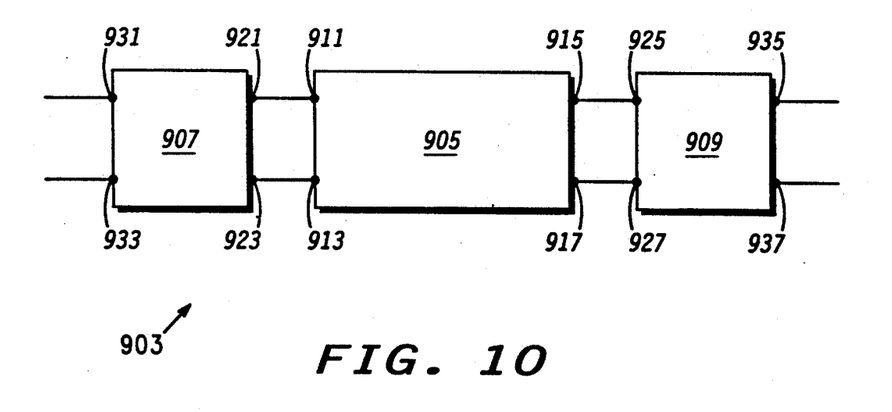
FIG. 10 is a simplified schematic diagram of matching circuits together with an electronic component, in accordance with the present invention.

FIG. 10 is a simplified schematic diagram of electronic component 905 together with matching circuits 907, 909. Electronic component 905 may comprise an acoustic wave filter, an amplifier or any other type of electronic component. For simplicity, electronic component 905 is illustrated as having interconnections 911, 913, 915 and 917, however, electronic component 905 may have more or fewer interconnections as appropriate. By way of example and not intended to be limiting, electronic component 905 may correspond to acoustic wave filter 910 of FIG. 9, with electrical interconnections 947, 949, 977 and 979 of acoustic wave filter 910 corresponding, for example, to interconnections 911, 913, 915 and 917 of electronic component 905.

Matching circuit 907 has interconnections 921 and 923 coupled to interconnection 911 and 913 of electronic component 905 and interconnections 931 and 933 coupled to external electronic circuitry (not shown). By way of example and not intended to be limiting, microelectronic inductance 950 of FIG. 9 may correspond to matching circuit 907 of FIG. 10, with, for example, electrical interconnections 957, 959 corresponding to interconnections 921, 923 (i.e. coupled in shunt thereto) or to interconnections 921, 931 (i.e., coupled in series therewith).

Matching circuit 909 has interconnections 925 and 927 coupled to interconnections 915 and 917 of electronic component 905 and interconnections 935 and 937 coupled to external electronic circuitry (not shown). By way of example and not intended to be limiting, microelectronic inductance 950' of FIG. 9 may correspond to matching circuit 909, with, for example, electrical interconnections 957', 959' corresponding to interconnections 925, 927 (i.e., coupled in shunt thereto) or to interconnections 925, 935 (i.e., coupled in series therewith).

An additional advantage accrues when acoustic matching elements such as microelectronic inductances 905, 950' of FIG. 9 are incorporated directly with an acoustic wave filter, such as acoustic wave filter 910. Similar substrate requirements coupled with related fabricational needs allow matching components such as microelectronic inductances 301 (FIG. 3), 801 (FIG. 8) and 950, 950' (FIG. 9) to be fabricated at the same time, by the same processes and on the same substrate as an acoustic wave filter. Such an arrangement can interconnect the matching circuits and the acoustic wave filter to one another automatically and so reduce requirements for bond wires used to achieve interconnections between elements fabricated on one substrate and other circuit elements not fabricated on that substrate. Interconnections between electronic component 905 of FIG. 10 and either or both of matching circuits 907, 909 not requiring connections external to a common substrate such as 320 may be made in the same fashion as were microelectronic inductances 950, 950' and acoustic wave filter 910 of FIG. 9.

Matching circuits 907, 909 act to transform the impedance or admittance of terminals 911, 913 and 915, 917, respectively, to match the impedance or admittance of external electronic circuitry (not shown) coupled to terminals 931, 933 and 935, 937, respectively. Such impedance transformations minimize electrical reflections due to impedance mismatch, increasing the efficiency of signal transmission to and from electronic component 905.

Figure 11:
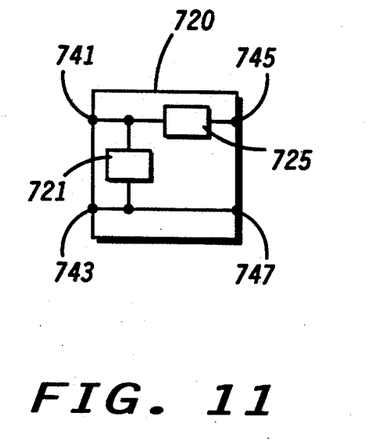
FIG. 11 is a schematic diagram of a representative matching circuit for an electronic component, in accordance with the present invention.

FIG. 11 is a schematic diagram of representative matching circuit 720 suitable for use as matching circuit 907 or 909. Matching circuit 720 comprises terminals 741 and 743, shunt reactive element 721, series reactive element 725 and terminals 745 and 747. Terminals 741 and 743 of FIG. 11 correspond to either terminals 921 and 923 or to terminals 925 and 927 of FIG. 10, respectively, while other terminals 745 and 747 of FIG. 11 correspond to terminals 931 and 933 or to terminals 935 and 937, respectively.

In a given application, either or both shunt element 721 and series element 725 may be required to effect an impedance match between a component such as electronic component 905 of FIG. 10 and external electronic circuitry (not shown). Either or both shunt element 721 and series element 725 may comprise reactive circuits or elements such as inductors or capacitors or series and/or parallel combinations thereof. Either or both of matching elements 721, 725 may include acoustic wave inductances as shown in FIGS. 3 and 8, in accordance with the present invention.

Typically, terminals 741 and 743 are coupled to terminals 911 and 913 (FIG. 10) of electronic component 905, respectively, corresponding to terminals 921, 923 of matching circuit 907, while terminals 745 and 747 correspond to terminals 931 and 933, which are coupled to external circuitry (not shown). Alternatively, terminals 745 and 747 are coupled to terminals 911 and 913 (FIG. 10) of electronic component 905, respectively, corresponding to terminals 921, 923 of matching circuit 907, while terminals 741 and 743 correspond to terminals 931 and 933, which are coupled to external circuitry (not shown).

Similarly, terminals 745 and 747 may be coupled to terminals 915 and 917 (FIG. 10), respectively, of electronic component 905, corresponding to terminals 925, 927 of matching circuit 909, while terminals 741 and 743 correspond to terminals 935 and 937, which are coupled to external circuitry (not shown). Alternatively, terminals 741 and 743 may be coupled to terminals 915 and 917 (FIG. 10), respectively, of electronic component 905, corresponding to terminals 925, 927 of matching circuit 909, while terminals 745 and 747 correspond to terminals 935 and 937, which are coupled to external circuitry (not shown).

Further, some applications may require several such matching circuits 720 coupled in cascade between electronic component 905 and external circuitry in order to impedance match electronic component 905 to the relevant electrical environment.

Figure 12:
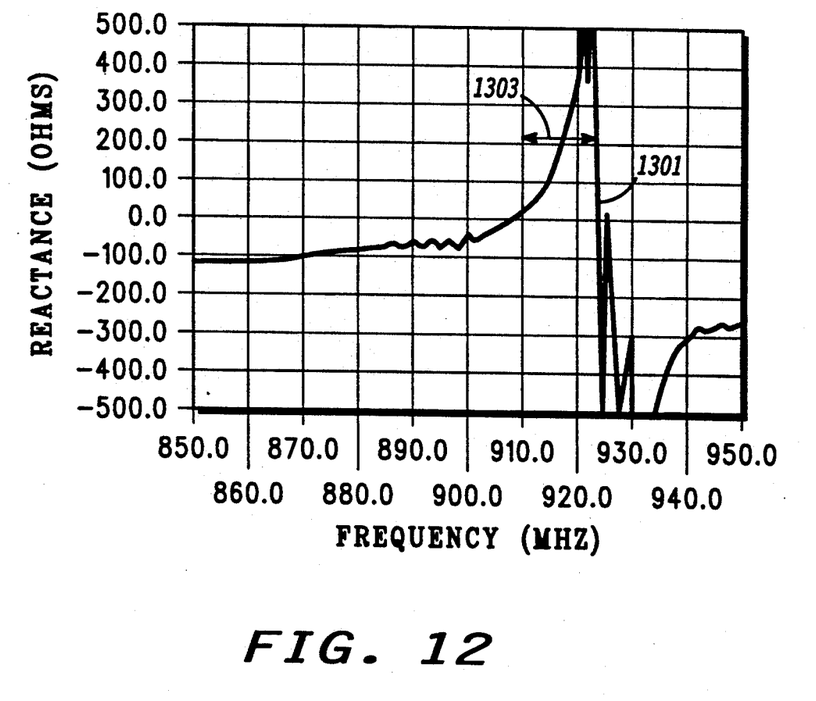
FIG. 12 is a graph of the calculated reactance of an acoustic wave transducer without reflectors.
Figure 13:
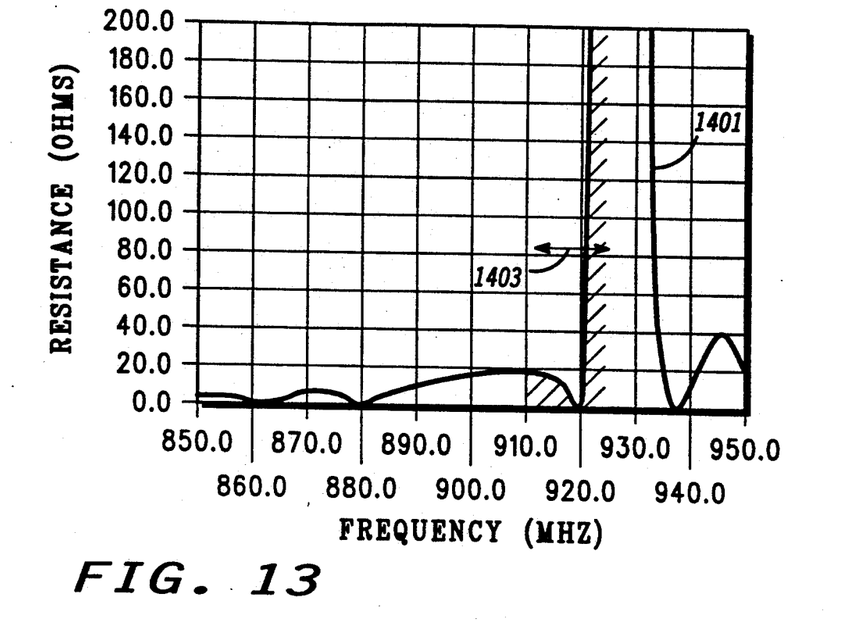
FIG. 13 is a graph of the calculated resistance of an acoustic wave transducer without reflectors.

FIGS. 12 and 13 each describe different aspects of the calculated performance of an acoustic wave transducer without reflectors which is chosen to satisfy or be in accordance with the principles of Eqs. 1 and/or 3. The data of FIGS. 12–14 were obtained by computer simulation using methods well known in the art. See, for example, Chapter 2 entitled "Circuit-Model Analysis and Design of Interdigital Transducers for Surface Acoustic Wave Devices" of *Physical Acoustics*, Vol. XV, published by Academic Press, Inc., 1981. A substrate of Y-cut, Z-propagating $LiNbO_3$ having $k^2 = 0.048$ and $C_s = 4.52$ picoFarads/centimeter was assumed for the calculations.

FIG. 12 is a graph of calculated reactance 1301 in Ohms versus frequency in MegaHertz of an acoustic wave transducer without reflectors. Reactance 1301 comprises reactances due to transducer capacitance and acoustic energy storage. It is positive, i.e., inductive, in nature over region 1303. Region 1303 extends from about 910 MegaHertz to about 925 MegaHertz for the particular example used in this calculation.

FIG. 13 is a graph of calculated resistance 1401 in Ohms versus frequency in MegaHertz of the same acoustic wave transducer structure as used in preparing the data shown in FIG. 12. Region 1403 of FIG. 13 corresponds to region 1303 of FIG. 13 and is seen to include portions having substantial resistance associated therewith, particularly to the right edge of region 1403. This situation corresponds to an inductance coupled with a resistance and provides inductive characteristics but with relatively low Q due to the high equivalent resistance.

Figure 14:
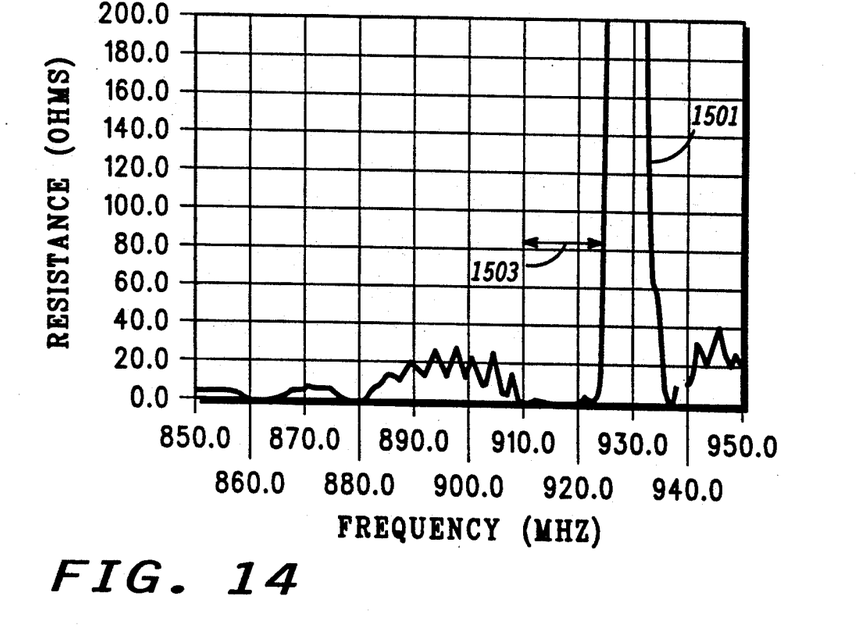
FIG. 14 is a graph of the calculated resistance of an acoustic wave transducer with reflectors, in accordance with the present invention.

FIG. 14 is a graph of calculated resistance 1501 in Ohms versus frequency in MegaHertz of an acoustic wave transducer having reflectors, in accordance with the present invention. Region 1503 of FIG. 14 corresponds to regions 1303, 1403 of FIGS. 12, 13, respectively, wherein the acoustic wave transducer exhibits inductive characteristics.

In contrast to region 1403 of FIG. 13, region 1503 corresponds to a portion of resistance graph 1501 wherein the calculated equivalent resistance values are very low, corresponding to a high quality factor inductive characteristic. This phenomenon is due to the resonance produced by inclusion of reflector structures such as 330 of FIG. 3 or 817, 827 of FIG. 8 together with transducers 310, 810 of FIGS. 3 and 8, respectively, in accordance with the principles of Eqs. 1 and/or 3, supra.

EXAMPLE

An experimental device of a type similar to that illustrated in FIG. 3 was constructed and tested. The results obtained therefrom are graphically displayed in FIGS. 15 and 16. The experimental device was constructed on a substrate of 128° Y-rotated, X-propagating $LiNbO_3$ having $k^2=0.055$ and $C_s=5.27$ picoFarads/centimeter. Thin film aluminum structures 2,000 Angstroms thick form the transducer and reflector electrodes. For this configuration, an acoustic velocity $v_a$ of about 3948 meters/second is realized. A wavelength of 8.4 micrometers was employed, providing a center frequency of about 470 MegaHertz. The experimental device was not optimized to provide the best possible performance.

The experimental device employed a transducer having $N=50$ electrode pairs providing a total transducer length L of 420 micrometers and an acoustic beamwidth of 200 micrometers. A gap of 9.7 micrometers separates the transducer from each reflector. The electrodes and gaps comprising the transducer were chosen to be 2.1 micrometers in width. The electrodes comprising the reflectors were chosen to have widths of 2.9 micrometers together with gaps of breadth 1.2 micrometers.

The dimensions of the electrodes and gaps in the transducer and reflectors were chosen in order to maintain the same wavelength throughout the device while increasing the reflectivity of the reflector electrodes and reducing the reflectivity of the transducer electrodes. Two hundred reflector electrodes comprise each of the reflector structures.

Figure 15:
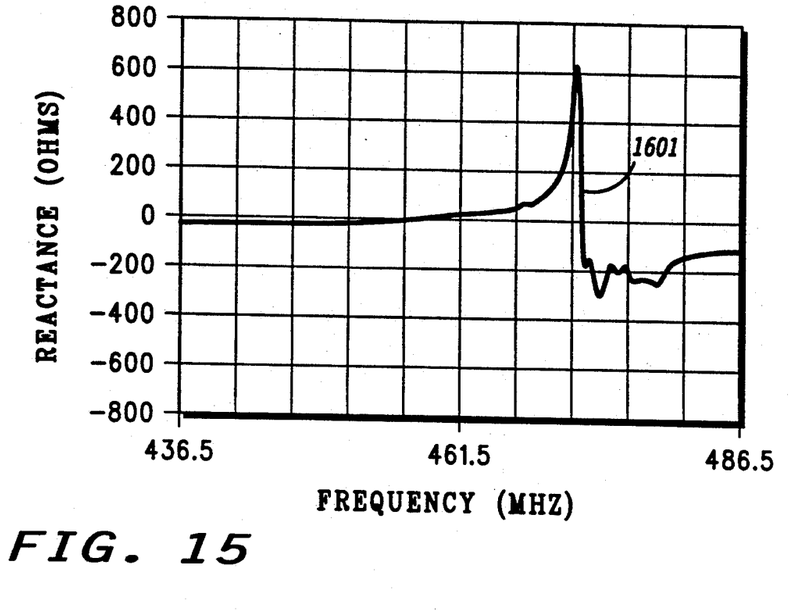
FIG. 15 is a graph of the imaginary portion of an experimentally measured impedance, in accordance with the present invention.

FIG. 15 is a graph of imaginary portion 1601 in Ohms of an experimentally measured impedance versus frequency in MegaHertz, obtained on the structure described hereinabove.

Imaginary portion 1601 of the experimentally measured impedance is seen to be positive and so to exhibit inductive characteristics over a region extending from about 455.5 MegaHertz (one division to the left of the center of the graph) to about 471.5 MegaHertz (two divisions to the right of the center of the graph), corresponding to regions 1303, 1403 and 1503 of FIGS. 12-14.

Figure 16:
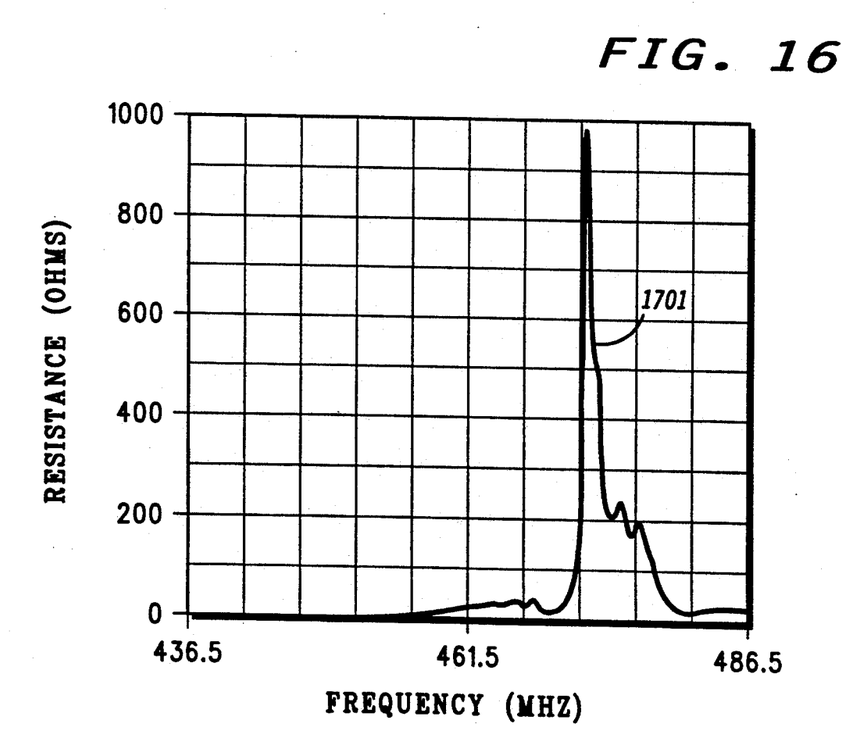
FIG. 16 is a graph of the real portion of an experimentally measured impedance, in accordance with the present invention.

FIG. 16 is a graph of real portion 1701 in Ohms of an experimentally measured impedance versus frequency in MegaHertz, for the same structure as employed with FIG. 15. Real portion 1701 of the experimentally measured impedance is small over the above-identified region wherein curve 1601 displays inductive characteristics. The Q of this device at a frequency of about 470.2 MegaHertz is about 6.5. The Q may be increased by increasing the reflectivity obtained per reflection element, by increasing the reflectivity obtained from each reflector and by reducing parasitic losses due to metallization and bond wire resistance, bulk mode acoustic radiation and other effects.

Further improvements in the Q are possible by improving the reflectivity of the reflectors employed in the device. Other factors influencing the Q attainable by the present invention include resistive losses due to the finite conductivity of the metallization employed for the transducer structure, excitation of bulk modes within the substrate and other parasitic effects.

The Q illustrated by the data of FIGS. 15 and 16 shows that the present invention realizes performance comparable with the prior art illustrated in FIG. 1. However, the surface acoustic wave inductor occupies substantially less surface area than a conventional spiral inductor of the same value. This is a significant advance, since occupied area and cost are typically highly correlated. Further, the present invention is easily realized on the same substrate and by the same fabrication techniques as acoustic wave filters. This allows substantial simplification of the manufacture of electronic assemblies employing such filters by providing acoustic wave filters having predetermined terminal impedances without added assembly operations.

FIGS. 15 and 16 show that microelectronic acoustic devices exhibiting inductive properties have been realized in compact form compatible with manufacturing processes appropriate to acoustic wave devices.

Figure 17:
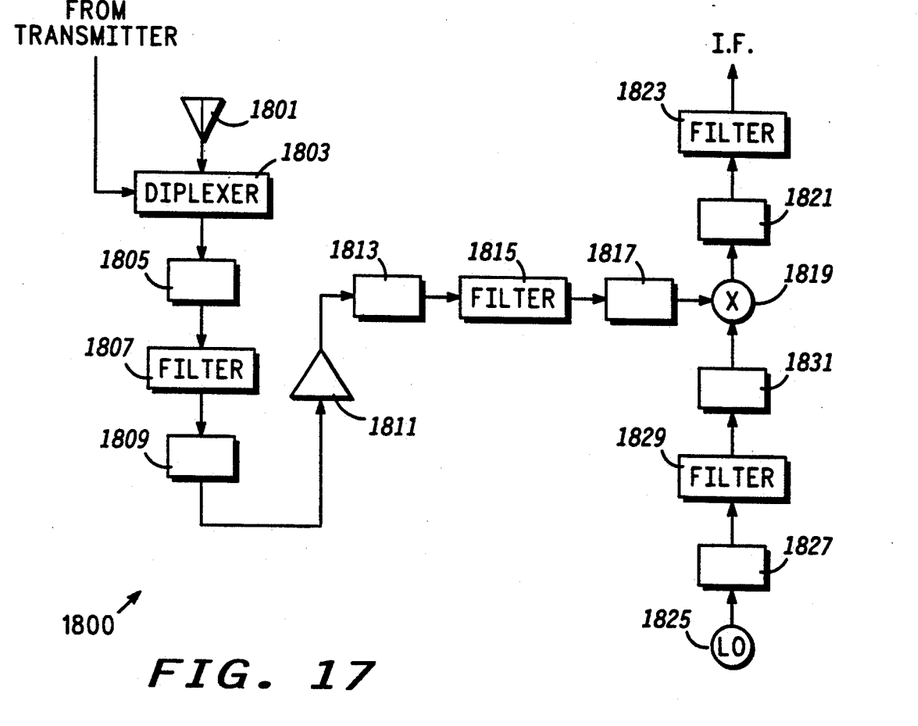
FIG. 17 is a simplified block diagram of a portion of a radio frequency receiver including acoustic wave inductors, in accordance with the present invention.

FIG. 17 is a block diagram of portion 1800 of a radio frequency receiver or other radio frequency apparatus including impedance matching in accordance with the present invention. Apparatus 1800 includes antenna 1801, by way of example, used to receive and/or transmit signals. Alternatively, antenna 1801 could be replaced by a fiber-optic link or cable or other signal transmissive media.

Diplexer 1803 is coupled to antenna 1801 and to a transmitter portion (not shown). Diplexer 1803 is a special purpose filter which couples received signals (but not much larger signals from an attached transmitter) to filter 1807 via optional matching circuit 1805 according to the present invention. Filter 1807 is coupled to amplifier 1811 via optional matching element 1809 according to the present invention. The output of amplifier 1811 is transmitted to filter 1815 via optional matching element 1813 according to the present invention. Filter 1815 transmits its output to mixer 1819 via optional matching element 1817 according to the present invention. The signal from filter 1815 is combined in mixer 1819 with another signal from local oscillator 1825 coupled via filter 1829. Matching elements 1827, 1831 and 1821 are optionally provided with filters 1823, 1829. The output signal from mixer 1819 is then filtered by filter 1823 to provide the IF output signal. The arrangement of the present invention may be used to provide any or all of matching elements 1805, 1809, 1813, 1817, 1821, 1827 and 1831. Further, matching elements 1805, 1809, 1813, 1817, 1821, 1827 and 1831 are conveniently integrated within filters 1803, 1807, 1815, 1823 and 1829 or other elements of radio portion 1800, as illustrated in FIG. 9.

A method for realizing a microelectronic acoustic inductance comprises the steps of providing an acoustic wave propagating substrate and coupling an acoustic wave transducer to the acoustic wave propagating substrate to provide a microelectronic inductance. The acoustic wave transducer has a length L such that $L \geq 1.5\, v_a/f_o k^2$, where $v_a$ represents an acoustic velocity, $f_o$ represents an acoustic wave transducer center frequency and $k^2$ denotes an acoustic wave propagating substrate electromechanical coupling coefficient. Alternatively, the acoustic wave transducer may have a number of electrode pairs N in accordance with $N > 1.5/k^2$.

The method desirably also includes providing a first acoustic wave reflector disposed to a first side of the acoustic wave transducer, and may also include providing a second acoustic wave reflector disposed to a second side of the acoustic wave transducer. The first and second acoustic wave reflectors desirably comprise electrodes spaced an integral number of acoustic wavelengths apart, and may include an acoustic wave transducer comprising electrodes one-fourth of an acoustic wavelength in width.

Alternatively, the acoustic wave reflectors may comprise electrodes spaced one-half of an acoustic wavelength apart. The method may further comprise coupling an acoustic wave filter to the microelectronic inductor to provide a predetermined impedance.

Thus, a microelectronic component exhibiting inductance has been described which overcomes problems and accomplishes certain advantages relative to prior art methods and arrangements. The improvements over known technology are significant. For example, the excessive size, fabrication complexities, power consumption, signal distortion and low quality factors associated with various prior art microelectronic inductors are avoided. Further, the surface acoustic wave matching inductances are readily integrated with surface acoustic wave filters suitable for use in such apparatus, thereby reducing the total parts count of the radio.

By now it should be appreciated that the invention discloses acoustic devices displaying inductive properties and having the advantages of small size, good quality factor and low power consumption. The invention has further advantages in being compatible with the fabrication of acoustic wave filters and in eliminating some interconnections when monolithically co-integrated with acoustic wave filters.

A further advantage is that the invented inductive elements are achieved using a single level metallization photolithographic fabrication process.

A further advantageous feature is the ability to readily combine the present invention with an acoustic wave filter on a common microelectronic substrate.

Thus, there has also been provided, in accordance with an embodiment of the invention, a microelectronic component exhibiting inductive properties which fully satisfies the aims and advantages set forth above. While the invention has been described in conjunction with a specific embodiment, many alternatives, modifications and variations will be apparent to those of ordinary skill in the art in light of the foregoing description. Accordingly, the invention is intended to embrace all such alternatives, modifications and variations as fall within the spirit and broad scope of the appended claims.

I claim:

1. A method for realizing a microelectronic filter comprising steps of:
   providing an acoustic wave propagating substrate;
   coupling a first acoustic wave transducer to the acoustic wave propagating substrate to provide a microelectronic inductance, the first acoustic wave transducer having an effective length $L_{eff}$ wherein:

$$L_{eff} \geq C_2 v_a / f_o k^2,$$

where $C_2$ is a numerical factor such that $C_2 \geq 2$, $v_a$ represents an acoustic velocity, $f_o$ represents an acoustic wave transducer center frequency and $k^2$ denotes an acoustic wave propagating substrate electromechanical coupling coefficient; and
   disposing an acoustic wave filter on the acoustic wave propagating substrate, the acoustic wave filter including second and third acoustic wave transducers acoustically coupled to each other, the first acoustic wave transducer being electrically coupled to the second acoustic wave transducer and providing an electrical impedance match for the second acoustic wave transducer over at least a first frequency range.

2. A method as claimed in claim 1, further comprising a step of providing a first acoustic wave reflector disposed to a first side of the acoustic wave transducer in a propagation path of at least some of an acoustic wave emitted from the acoustic wave transducer.

3. A method as claimed in claim 2, further comprising a step of providing a second acoustic wave reflector disposed to a second side of the acoustic wave transducer in another propagation path of at least some of the acoustic wave emitted from the acoustic wave transducer.

4. A method as claimed in claim 3, wherein said steps of providing said first and second acoustic wave reflectors include steps of providing first and second acoustic wave reflectors comprising electrodes spaced an integral number of acoustic wavelengths apart.

5. A method as claimed in claim 1, wherein said step of coupling an acoustic wave transducer includes a step of coupling an acoustic wave transducer comprised of electrodes one-fourth of an acoustic wavelength in width.

6. A method as claimed in claim 3, wherein said steps of providing said first and second acoustic wave reflectors include steps of providing first and second acoustic wave reflectors comprising electrodes spaced one-half of an acoustic wavelength apart.

7. A method as claimed in claim 1, wherein said disposing step further includes a step of disposing the first acoustic wave filter in shunt with the second acoustic wave transducer to provide an electrical impedance match for the second acoustic wave transducer over at least a first frequency range.

8. A method as claimed in claim 1, wherein said disposing step further includes a step of disposing the first acoustic wave filter in series with the second acoustic wave transducer to provide an electrical impedance match for the second acoustic wave transducer over at least a first frequency range.

9. A method for providing an acoustic wave filter having a predetermined electrical impedance using a microelectronic inductance, comprising steps of:
   providing a piezoelectric substrate;
   coupling a first acoustic wave transducer to the piezoelectric substrate to provide a microelectronic inductance, the acoustic wave transducer having a number of electrode pairs N greater than a numerical constant $C_1$ divided by a piezoelectric substrate electromechanical coupling coefficient, where $C_1$ is a numerical factor such that $C_1 > 2$;
   coupling an acoustic wave filter to the piezoelectric substrate, the acoustic wave filter including at least a second acoustic wave transducer; and
   coupling the microelectronic inductance to the second acoustic wave transducer to provide a predetermined electrical impedance.

10. A method as claimed in claim 9, wherein coupling the microelectronic inductance to the second acoustic wave transducer includes coupling the microelectronic inductance in series with the second acoustic wave transducer to provide an electrical impedance match for the second acoustic wave transducer over at least a first frequency range.

11. A method as claimed in claim 9, wherein coupling the microelectronic inductance to the second acoustic wave transducer includes coupling the microelectronic inductance in shunt with the second acoustic wave transducer to provide an electrical impedance match for the second acoustic wave transducer over at least a first frequency range.

12. A microelectronic filter including in combination:
   an acoustic wave propagating substrate;
   an acoustic wave transducer coupled to said acoustic wave propagating substrate to provide a microelectronic inductance, said acoustic wave transducer having an effective length $L_{eff}$ such that:

$$L_{eff} \geq C_2 v_a/f_o k^2,$$

where $C_2$ is a numerical factor such that $C_2 \geq 2$, $v_a$ represents an acoustic velocity, $f_o$ represents an acoustic wave transducer center frequency and $k^2$ denotes an acoustic wave propagating substrate electromechanical coupling coefficient; and an acoustic filter disposed on acoustic wave propagating substrate, said acoustic filter including an input and an output, said input electrically coupled to said microelectronic inductance to provide an electrical impedance match over at least a first range of frequencies.

13. A microelectronic filter as claimed in claim 12, wherein said microelectronic inductance is coupled in series with said input to provide an electrical impedance match to a predetermined impedance over said first range of frequencies.

14. A microelectronic filter as claimed in claim 12, wherein said microelectronic inductance is coupled in shunt with said input to provide an electrical impedance match to a predetermined impedance over said first range of frequencies.

15. A component as claimed in claim 12, further comprising:
a first acoustic wave reflector disposed to a first side of said acoustic wave transducer( in a propagation path of at least some of an acoustic wave emitted from said acoustic wave transducer; and
a second acoustic wave reflector disposed to a second side of said acoustic wave transducer in another propagation path of at least some of said acoustic wave emitted from said acoustic wave transducer.

16. A component as claimed in claim 12, wherein said acoustic wave propagating substrate comprises a member of the group consisting of lithium niobate, lithium tantalate, bismuth germanium oxide, bismuth silicon oxide, quartz, gallium arsenide, silicon, cadmium sulfide, aluminum nitride and zinc oxide.

17. A component as claimed in claim 15, wherein said first and second acoustic wave reflectors comprise reflection elements spaced an integral number of wavelengths apart.

18. An apparatus comprising a surface acoustic wave filter having a predetermined input impedance including in combination:
an acoustic wave propagating substrate;
a first acoustic wave transducer acoustically coupled to said acoustic wave propagating substrate to provide an acoustic inductance, said first acoustic wave transducer having an effective number of electrode pairs $N_{eff}$ such that:

$$N_{eff} > C_1/k^2,$$

where $C_1$ is a numerical factor such that $C_1 > 2$ and $k^2$ denotes an acoustic wave propagating substrate electromechanical coupling coefficient; and
an acoustic wave filter acoustically coupled to said acoustic wave propagating substrate and electrically coupled to said acoustic inductance to provide a predetermined input impedance, said acoustic wave filter comprising at least a second acoustic wave transducer acoustically coupled to said acoustic wave propagating substrate and electrically coupled to said first acoustic wave transducer.

19. An apparatus as claimed in claim 18, wherein said first acoustic wave transducer is electrically couple din series with said second acoustic wave transducer to provide an electrical impedance match to a predetermined impedance over a range of frequencies.

20. An apparatus as claimed in claim 18, wherein said first acoustic wave transducer is electrically coupled in shunt with said second acoustic wave transducer to provide an electrical impedance match to a predetermined impedance over a range of frequencies.

21. An apparatus as claimed in claim 18, further comprising a first acoustic wave reflector disposed to a first side of said acoustic wave transducer in a propagation path of at least some of an acoustic wave emitted from said acoustic wave transducer.

22. An apparatus as claimed in claim 21, further comprising a second acoustic wave reflector disposed to a second side of said acoustic wave transducer in another propagation path of at least some of said acoustic wave emitted from said acoustic wave transducer.

23. In a radio frequency apparatus, at least one acoustic wave inductive device comprising:
an acoustic wave propagating substrate for supporting propagation of acoustic waves;
an input for supplying electrical input signals;
a first acoustic wave transducer electrically coupled to said input and acoustically coupled to said acoustic wave propagating substrate to provide an acoustic wave inductive device, said first acoustic wave transducer having a length L in accordance with:

$$L \geq C_2 v_a/f_o k^2,$$

where $C_2$ is a numerical factor such that $C_2 \geq 2$, $v_a$ represents an acoustic velocity, $f_o$ represents a center frequency of said first acoustic wave transducer and $k^2$ denotes an acoustic wave propagating substrate electromechanical coupling coefficient; and
an acoustic wave filter including second and third acoustic wave transducers acoustically coupled to each other, said first acoustic wave transducer electrically coupled to said second acoustic wave transducer to provide an electrical impedance match over a first range of frequencies.

24. An apparatus as claimed in claim 23, said at least one acoustic wave inductive device further comprising means for reflecting acoustic waves, said acoustic reflector means located in a propagation path of at least some of said acoustic signals.

25. An apparatus as claimed in claim 24, wherein said acoustic reflector means further comprises:
a first acoustic reflector for reflecting acoustic waves, said first acoustic reflector located to a first side of said first acoustic wave transducer and in a principal propagation path of at least some of said acoustic signals; and
a second acoustic reflector for reflecting acoustic waves, said second acoustic reflector located to a second side of said first acoustic wave transducer and in another principal propagation path of at least some of said acoustic signals.

26. An apparatus as claimed in claim 24, wherein said first and second acoustic wave reflectors comprise reflection elements spaced an integer number of wavelengths apart.

27. An apparatus as claimed in claim 23, wherein said first acoustic wave transducer is electrically coupled in shunt with said second acoustic wave transducer to provide an electrical impedance match to a predetermined impedance over said first range of frequencies.

28. An apparatus as claimed in claim 23, wherein said first acoustic wave transducer is electrically coupled in series with said second acoustic wave transducer to provide an electrical impedance match to a predetermined impedance over said first range of frequencies.

29. An apparatus as claimed in claim 24, said acoustic wave filter further comprising a fourth acoustic wave transducer coupled to said third acoustic wave transducer to provide an impedance match over a second range of frequencies, said fourth acoustic wave transducer having a length L in accordance with:

$$L \geq C_2 v_{o4}/f_{o4} k_4^2,$$

where $C_2$ is a numerical factor such that $C_2 \geq 2$, $v_{o4}$ represents an acoustic velocity, $f_{o4}$ represents a center frequency of said fourth acoustic wave transducer and $k_4^2$ denotes an acoustic wave propagating substrate electromechanical coupling coefficient.

30. An apparatus as claimed in claim 23, wherein said acoustic wave propagating substrate comprises a member of the group consisting of lithium niobate, lithium tantalate, bismuth germanium oxide, bismuth silicon oxide, quartz, gallium arsenide, silicon, cadmium sulfide, aluminum nitride and zinc oxide.

31. An apparatus as claimed in claim 29, wherein said fourth acoustic wave transducer is electrically coupled in series with said third acoustic wave transducer to provide an electrical impedance match to a predetermined impedance over said second range of frequencies.

32. An apparatus as claimed in claim 29, wherein said fourth acoustic wave transducer is electrically coupled in shunt with said third acoustic wave transducer to provide an electrical impedance match to a predetermined impedance over said second range of frequencies.

* * * * *